US012693558B2

(12) United States Patent
Guo et al.

(10) Patent No.: US 12,693,558 B2
(45) Date of Patent: Jul. 28, 2026

(54) TRANSPORTATION VEHICLE COMPONENT HAVING INTEGRATED ELECTRONIC-PAPER DISPLAY AND METHOD FOR FORMING SUCH COMPONENT

(71) Applicant: GM Global Technology Operations LLC, Detroit, MI (US)

(72) Inventors: Yujie Guo, Thornhill (CA); Julien P. Mourou, Bloomfield Hills, MI (US); Chris A. Oberlitner, Shelby Township, MI (US); Shane Russell Appel, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 584 days.

(21) Appl. No.: 18/163,668

(22) Filed: Feb. 2, 2023

(65) Prior Publication Data

US 2024/0264480 A1    Aug. 8, 2024

(51) Int. Cl.
G02F 1/1333    (2006.01)
B60R 13/10    (2006.01)
(Continued)

(52) U.S. Cl.
CPC ........ G02F 1/133385 (2013.01); B60R 13/10 (2013.01); G02F 1/133331 (2021.01); G02F 1/167 (2013.01); G02F 1/16753 (2019.01); H05K 7/20963 (2013.01); B29C 45/14 (2013.01); B29K 2995/0026 (2013.01); B29L 2031/7232 (2013.01)

(58) Field of Classification Search
CPC ......... B60Q 1/56; B60R 13/10; B60R 13/105; G02F 1/133385; G02F 1/16753; G02F 1/133331; G02F 1/167; H05K 7/20963; B29C 45/14; B29K 2995/0026; B29L 2031/7232
See application file for complete search history.

(56) References Cited

U.S. PATENT DOCUMENTS

| | | | | |
|---|---|---|---|---|
| 5,105,179 A | * | 4/1992 | Smith ...................... | B60Q 1/56 340/815.45 |
| 10,955,670 B2 | * | 3/2021 | Fransson ................. | G06F 3/017 |

(Continued)

FOREIGN PATENT DOCUMENTS

| | | | | |
|---|---|---|---|---|
| CN | 215264319 U | * | 12/2021 | ............. G02F 1/167 |
| DE | 19721058 A1 | * | 11/1998 | ....... B29C 45/14647 |

(Continued)

OTHER PUBLICATIONS

3M Digital License Plate (LP) Reflective LP Sheeting Series 9250e (Year: 2017).*

(Continued)

*Primary Examiner* — Ricky L Mack
(74) *Attorney, Agent, or Firm* — CANTOR COLBURN LLP

(57) ABSTRACT

A body component for a transportation vehicle comprising an e-paper visible from a front side of the body component; a thermally protective material at least partially surrounding the e-paper; an injection molded body element located around at least a portion of the thermally protective film can be used on a transportation device to provide a digital image.

19 Claims, 6 Drawing Sheets

(51) Int. Cl.

| | | |
|---|---|---|
| *G02F 1/167* | (2019.01) | |
| *G02F 1/16753* | (2019.01) | |
| *H05K 7/20* | (2006.01) | |
| *B29C 45/14* | (2006.01) | |
| *B29L 31/00* | (2006.01) | |

(56) References Cited

U.S. PATENT DOCUMENTS

| | | | | |
|---|---|---|---|---|
| 11,142,141 | B1 * | 10/2021 | Mason | G09G 3/20 |
| 11,836,738 | B1 * | 12/2023 | Johnson | B60Q 1/5035 |
| 2004/0218273 | A1 * | 11/2004 | Mimura | G02B 5/124 |
| | | | | 359/530 |
| 2008/0122137 | A1 * | 5/2008 | Hamaoka | B29C 45/1671 |
| | | | | 264/255 |
| 2012/0194898 | A1 * | 8/2012 | Tsai | G02F 1/16756 |
| | | | | 156/150 |
| 2014/0118947 | A1 * | 5/2014 | Chen | H10K 59/874 |
| | | | | 361/748 |

| | | | | |
|---|---|---|---|---|
| 2016/0216748 | A1 * | 7/2016 | Jenkins | G06F 3/0412 |
| 2017/0194596 | A1 * | 7/2017 | Shen | H10K 59/8722 |
| 2017/0274841 | A1 * | 9/2017 | Beenken | G09F 7/00 |
| 2017/0293832 | A1 * | 10/2017 | Pai | G06K 19/07758 |
| 2020/0045823 | A1 * | 2/2020 | Tomar | H05K 1/162 |

FOREIGN PATENT DOCUMENTS

| | | | | | |
|---|---|---|---|---|---|
| JP | | 2016075719 A | * | 5/2016 | G02F 1/17 |
| WO | WO-2006095781 | A1 | * | 9/2006 | B29C 45/1675 |
| WO | WO-2017215840 | A1 | * | 12/2017 | B44C 1/1729 |
| WO | WO-2019112171 | A1 | * | 6/2019 | B60K 37/20 |

OTHER PUBLICATIONS

E Paper License Plates Now Street Legal in California—IEEE Spectrum (Year: 2022).*

* cited by examiner

TRANSPORTATION VEHICLE COMPONENT HAVING INTEGRATED ELECTRONIC-PAPER DISPLAY AND METHOD FOR FORMING SUCH COMPONENT

INTRODUCTION

The subject disclosure relates to body components for transportation vehicles including a display and a method of forming such components.

Digital displays, such as digital license plates, on the exterior of transportation vehicles have been proposed. However, cost effective manufacture of durable and reliable displays without damage to the display can be challenging. It would be desirable to provide an integrated body component having a display that can be efficiently manufactured at low cost while providing good durability.

SUMMARY

In one exemplary embodiment disclosed herein is a body component for a transportation vehicle comprising an electronic paper (referred to as e-paper) visible from a front side of the body component; a thermally protective material at least partially surrounding the e-paper; and an injection molded body element located around at least a portion of the thermally protective film.

In addition, the body component can include one or more of the following features. The thermally protective material comprises a polymeric material, such as for example, polycarbonates, polyacrylates, polymethacrylates, polyesters, such as polyethylene terephthalate, polyethylene, polypropylene, polyurethanes, or combinations thereof. The thermally protective material comprises multi-layer film having a thermally conductive layer and a polymer layer, the polymer layer being located between the thermally conductive layer and the e-paper; wherein, optionally, the thermally conductive layer comprises boron nitride, graphene or indium tin oxide and has a thickness of 50 to 200 micrometers. Furthermore, the multi-layer film optionally comprises an adhesive layer in contact with the e-paper. The body component further comprises a transparent protective polymer on the front side of the body component through which the e-paper is visible. The thermally protective material is located on a front side of the e-paper, a backside of the e-paper, and side edges of the e-paper. The body component includes electrical leads connected to the e-paper and extending through the injection molded body element for connecting to a device to enable formation of an image on the e-paper.

In another exemplary embodiment, disclosed herein is a vehicle comprising the body component as described herein as an exterior body element. The body component can be a digital license plate.

In another exemplary embodiment, disclosed herein is a method of making the body component comprising providing the e-paper having the thermally protective material adjacent to the e-paper on edges of the e-paper and a backside of the e-paper, injection molding the body element around the thermally protective material.

The method can include one or more the following additional aspects. The method further comprises providing a transparent protective polymer on the front side of the e-paper. The thermally protective material is adjacent to the front side of the e-paper and the transparent protective polymer is injection molded over the thermally protective material adjacent to the front side of the e-paper. The thermally protective material is provided in the form of a film or a sheet, which can optionally be multi-layer. Such a multi-layer film or sheet can comprise a thermally conductive layer and a polymeric layer and the polymeric layer is located between the e-paper and the thermally conductive layer. The film or the sheet can be thermoformed around the e-paper or laminated to the e-paper. The injection molding of the body element occurs at a melt temperature of at least 250° C.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
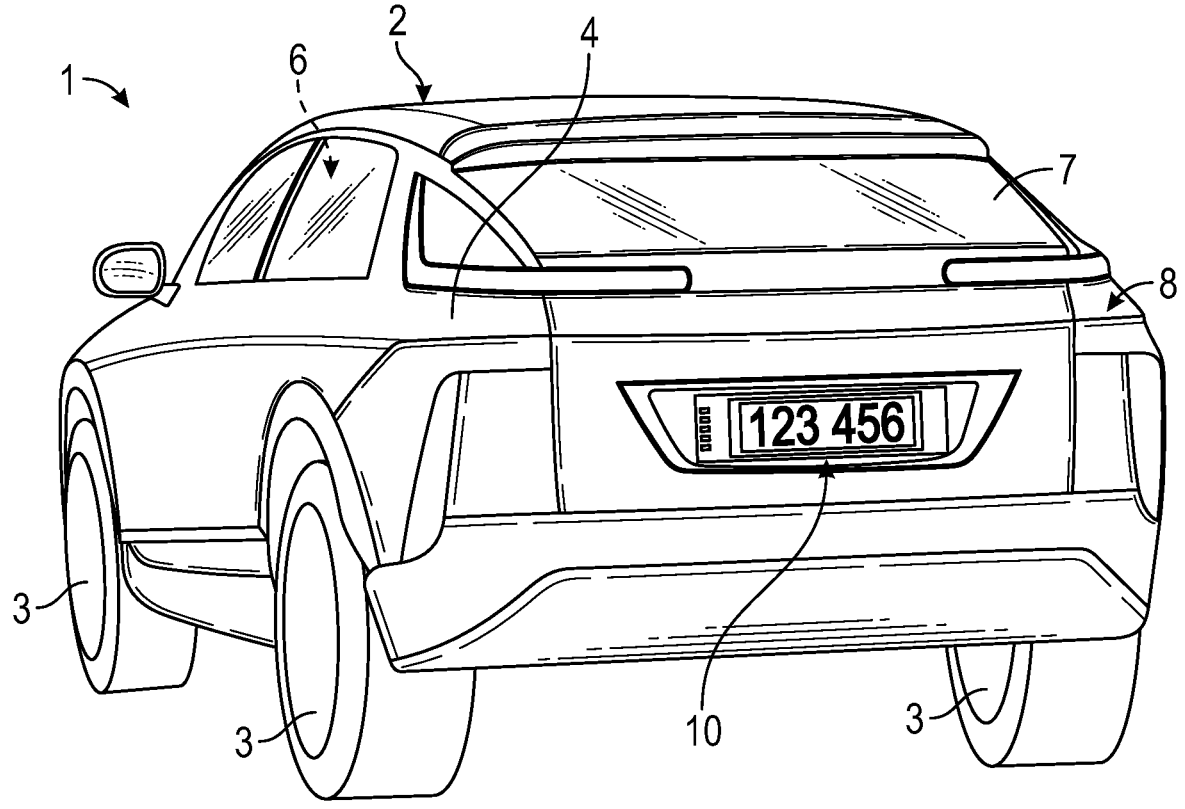
FIG. 1 is a perspective view of a vehicle including an exemplary body component with integrated display as disclosed herein.

The following description is merely exemplary in nature and is not intended to limit the present disclosure, its application or uses. It should be understood that throughout the drawings, corresponding reference numerals indicate like or corresponding parts and features.

Injection molding can be used form vehicle body components from polymer based materials. Electronic paper (e-paper) can be useful in a digital display for a transportation vehicle since when power is removed the image remains. However, e-paper can be sensitive to and potentially damaged by the temperatures needed to injection mold a body component for a vehicle. For example, e-paper can typically withstand temperatures of up to about 135° C. without sustaining damage. However, injection molding of transportation vehicle body parts can involve melt temperatures of the injection molded material of more than 250° C., or even more than 265° C.

Disclosed herein is a body component with integrated display that can be efficiently made into a durable integrated display at relatively low cost without damage to the display during manufacture. The body component comprises an e-paper visible from a front side of the body component; a thermally protective material at least partially surrounding the e-paper; and an injection molded body element located around at least a portion of the thermally protective film.

The body component with integrated display as disclosed herein can be used in the body of a transportation vehicle-e.g., automobile, truck, aircraft. For example, the body component with integrated display can be used for personalization of a vehicle or marking of the vehicle with a business name or the like. As another example, the integrated body with integrated display can be an integrated digital license plate on a vehicle.

A vehicle in accordance with a non-limiting example, is indicated generally at 1 in FIG. 1. Vehicle 1 includes a body 2 supported by a plurality of wheels 3. Body 2 is formed from various panels 4 that define a passenger compartment 6. One of the panels 4 can define a lift gate 8 that is pivotally connected to body 2. Lift gate 8 may be selectively opened to provide access to a rear cargo area (not separately labeled) of vehicle 1. Lift gate 8 may also include a glass cover 7. The body component 10 with integrated display is provided as a digital license plate.

Figure 2:
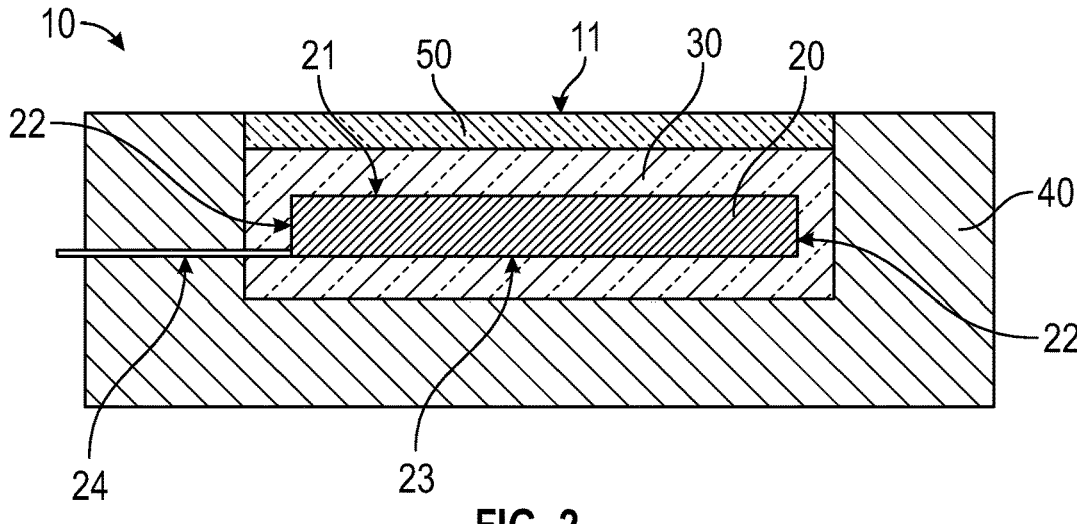
FIG. 2 is a cross section of an example of a body component with an integrated display embodying the disclosure.
Figure 3:
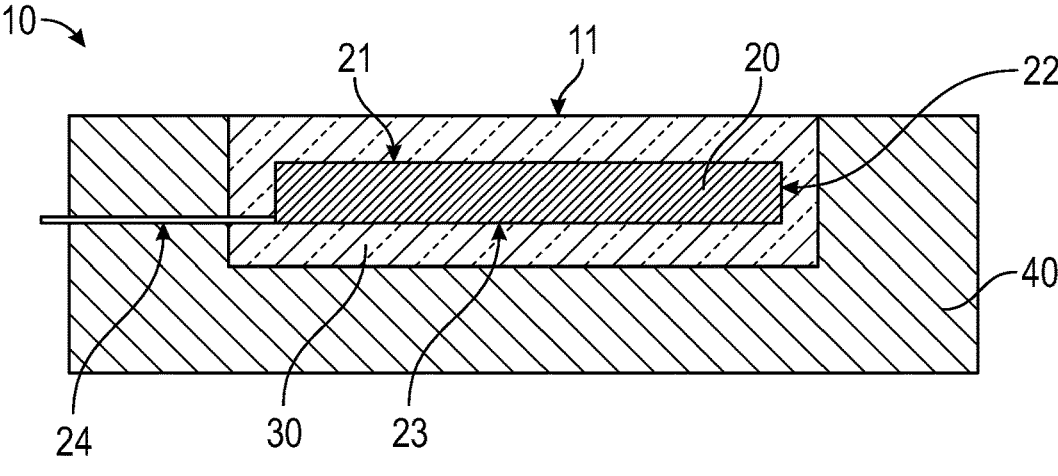
FIG. 3 is a is a cross section of an example of a body component with an integrated display embodying the disclosure.
Figure 4:
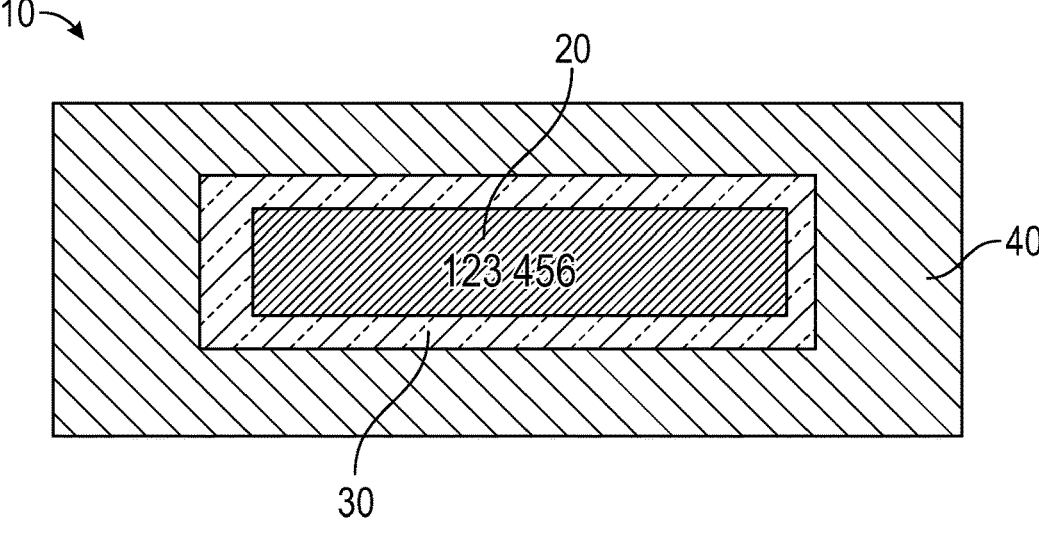
FIG. 4 is a front view of the front side of a body component as in FIG. 2.

In exemplary embodiments shown in FIGS. 2, 3, and 4, the body component 10 comprises a e-paper 20, a thermally protective material 30, and an injection molded body element 40. The body component 10 has a front side 11 through which the e-paper 20 is visible. As shown in FIG. 2, the body component 10 can include an additional transparent protective material 50. The transparent protective material 50 can be located over the thermally protective material 30. In another embodiment, not shown, the transparent protective material 50 can be directly adhered to the e-paper 20. Electrical leads 24 extend from the e-paper 20 through the thermally protective material 30 and the injection molded body element 40 to enable electrical connection of the e-paper 20 for purposes of forming an image in the e-paper 20. The e-paper 20 can have a thickness of from 0.2 to 1 mm.

The thermally protective material 30 can surround the e-paper 20 as shown in FIGS. 2 and 3. Alternatively, the thermally protective material 30 can surround (protect) those portions of the e-paper 20 that would be exposed to melted material of the injection molded body element 40 during injection molding. For example, in one exemplary embodiment there is no thermally protective material at the front side 21 of the e-paper 20. (not shown)

The thermally protective material 30 can comprise a polymeric material. Examples of such polymeric materials include polycarbonates, polyacrylates, polymethacrylates, polyesters, such as polyethylene terephthalate, polyethylene, polypropylene, polyurethanes. The polymeric material comprising the thermally protective material 30 is selected to have a high enough glass transition temperature, Tg, and/or melt temperature, Tm, such that it is not damaged during injection molding of the injection molded body element 40. Thus, the selection of the polymeric material for the thermally protective material 30 will be influenced by the melt temperature of the material used for the injection molded body element 40. For example, if the injection molded body element 40 comprises a material that is molded at a melt temperature of above 250° C., the polymeric material of the thermally protective material 30 can be selected to withstand such temperatures without significant damage.

Any portion of the thermally protective material 30 provided at the front side 11 of the body component over a front side 21 of the e-paper 20 is transparent such that the display image can be seen. The portion of the thermally protective material 30 located adjacent to edges 22 and backside 23 of the e-paper 20 can be transparent, translucent, or opaque. Filled materials can be used for that portion of the thermally protective material 30 that is on the edges 22 and backside 23 of the e-paper 20.

According to an exemplary embodiment the thermally protective material 30 can be provided in the form of a sheet or film. Any portion of such film or sheet located on the front side 21 of the e-paper 20, is transparent. The sheet or film can be single layer comprising a polymer that can withstand the melt temperature of the injection molded body element 40 as discussed above. Alternatively, the sheet or film can be a multi-layer film or sheet.

In one exemplary embodiment, the multi-layer film or sheet can comprise at least two layers of polymeric materials with at least one of the layers comprising the polymeric materials as described herein. In another exemplary embodiment, the multi-layer film or sheet comprises at least one layer of polymeric material as described herein and a thermally conductive layer. The multi-layer film or sheet can include optional adhesive or tie layers between adjacent layers of the multi-layer film or sheet or between the sheet and the e-paper 20.

Figure 5:
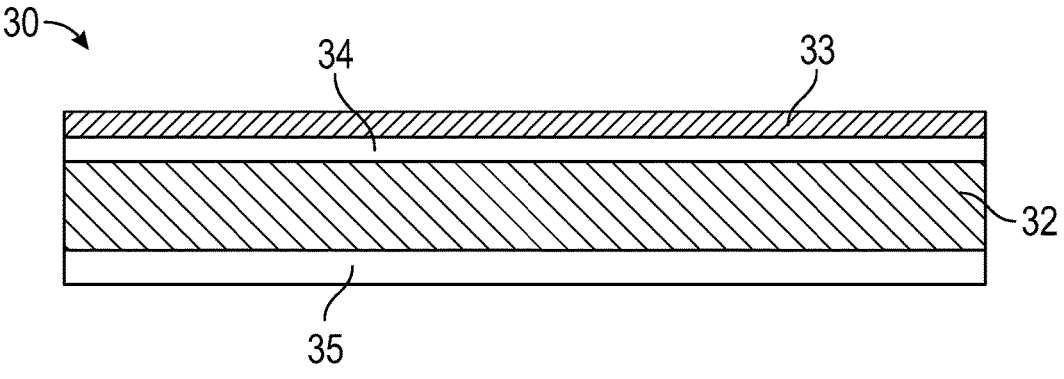
FIG. 5 is an example of a multilayer film or sheet as can be used in the body component with integrated display of the invention.
Figure 10:
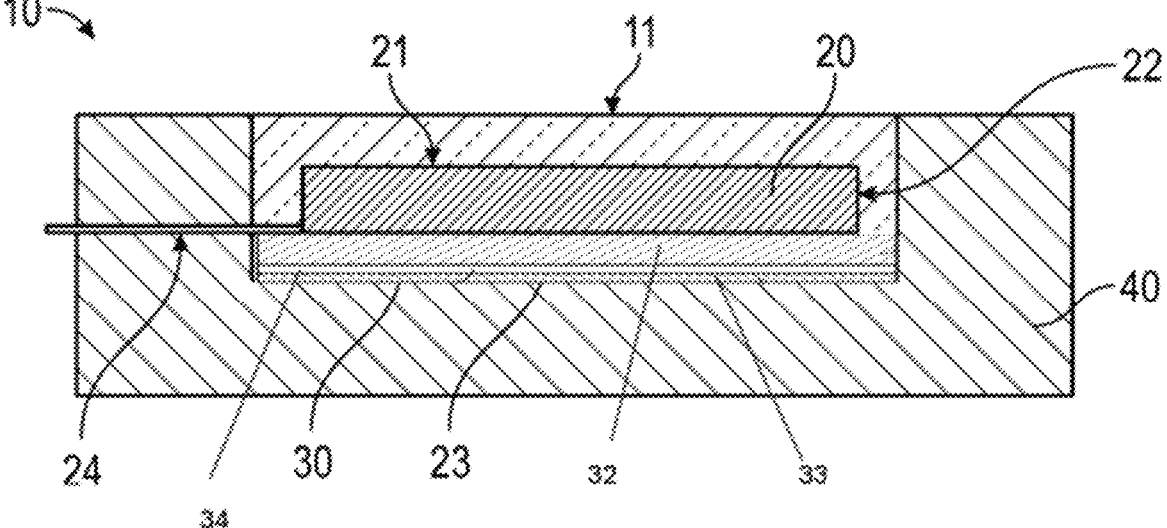
FIG. 10 is a is a is a cross section of an example of a body component with an integrated display embodying the disclosure.

FIG. 5 shows one example where the thermally protective material 30 comprises a multi-layer sheet or film having at least one polymeric layer 32 and a thermally conductive layer 33. Also shown are optional adhesive or tie layers 34 and 35. As used in the body component 10, the multi-layer sheet or film is oriented such that the thermally conductive layer 33 is located away from the from the front side 21 of the e-paper 20. See FIG. 10. Although only one polymeric layer 32 is shown, in FIG. 5, two, three, four, or more polymeric layers can be used. Similarly, although only one thermally conductive layer 33 is shown, two, three, four, or more thermally conductive layers can be used. For example, thermally conductive layers and polymeric layers may be provided in alternating sequence in the multi-layer film or sheet, with or without optional tie or adhesive layers between the thermally conductive layers and the polymeric layers.

Any portion of a thermally conductive layer 33 positioned on the front side 21 of the e-paper 20 is transparent. Examples of transparent thermal conductive layers include thin layers comprising graphene or boron nitride, indium tin oxide, or the like. The graphene or boron nitride can be dispersed in a polymeric binder (e.g., a polyester such as polyethylene terephthalate). As another example the thermal conductive layer can comprise graphene or silver nanowires. The transparent thermal conductive layer 33 can have a thickness of, for example, about 50 to 200 micrometers.

Adjacent the side edges 22 and backside 23 of the e-paper 20, the multi-layer film or sheet can be transparent as described above, but does not need to be transparent. Thus, thermally conductive materials, such as carbon black or metal foils (e.g., aluminum foil) or thicker layers which could impede transparency can be used in those locations.

The thermally protective material 30 can have an overall thickness of, for example, 0.1 to 5, or 0.2 to 4, or 0.3 to 3 mm.

The injected molded body element 40 can comprise a material useful in vehicle body parts (e.g., automotive exterior grade plastics), such as acrylonitrile-butadiene-styrene polymers, polycarbonates, polyolefins used in exterior automotive parts. The injected molded material can be filled or unfilled. Examples of fillers include automotive exterior grade fillers, such as, for example, fiber glass, calcium carbonate, carbon black, and pigments.

The transparent protective material 50 can be, for example, a polycarbonate (e.g., hard coated polycarbonate), polyacrylates such as polymethylmethacrylate, polyurethanes, or polypropylenes. The transparent protective material can have thickness of, for example 1 to 5, 1.5 to 4, or 2 to 3 mm. The transparent conductive material can be provided before the injection molding of the injection molded body element 40 such that the injection molded body element 40 can contact or cover a portion of the transparent protective material adjacent to the edges 22.

Figure 8:
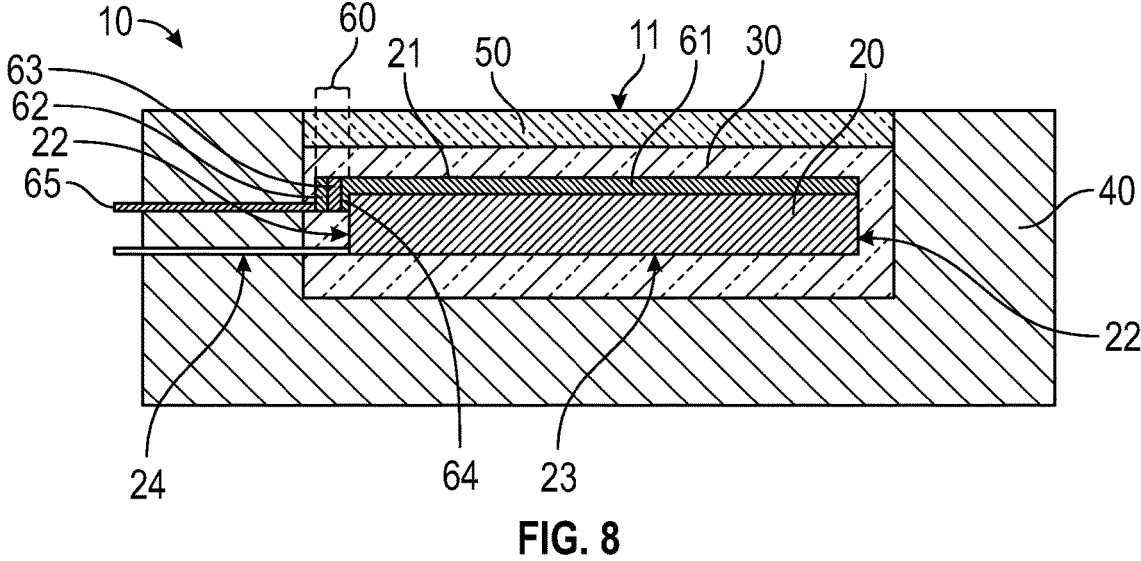
FIG. 8 is a is a is a cross section of an example of a body component with an integrated display and lighting embodying the disclosure.
Figure 9:
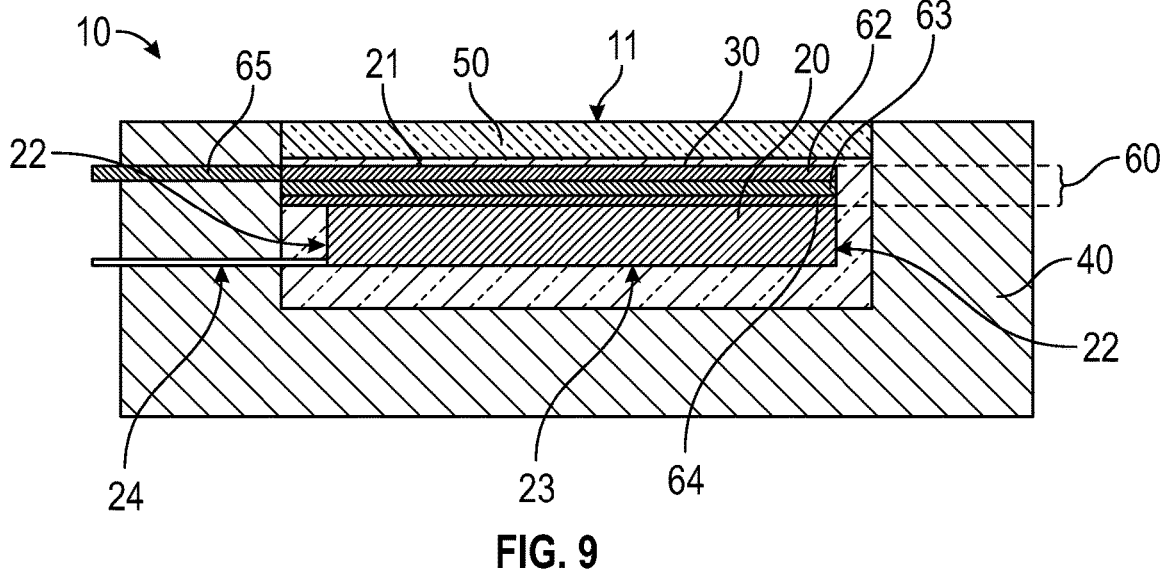
FIG. 9 is a is a is a cross section of an example of a body component with an integrated display and lighting embodying the disclosure.

E-paper provides a reflective image. Thus, optional lights can be incorporated into the integrated body component 10 to enable viewing of the image on the e-paper 20 in dark ambient lighting. For example, as shown in FIG. 8, a lighting element 60 can be used adjacent the e-paper 20 at a side edge 22, in optical communication with a clear film 61. Lighting element 60 can comprise a backplane 62, a micro-LED 63 and an optical coupling agent 64 and be electrically connectable through a lead 65. Alternatively, shown in FIG. 9, a micro-LED element 60 having a high transparency (e.g., about greater than about 90% transparency) and comprising a backplane 62, a micro-LED 63 and an optical coupling agent 64 can be used above the e-paper 20. In both examples, the body component 10 with integrated e-paper 20 and integrated lighting element 60 can be made by first placing the lighting element in the desired location adjacent to the e-paper 20 and then providing the thermally protective layer 30 and body element 40 around the desired regions as described herein.

The integrated body component 10 as disclosed herein can be made by providing the e-paper 20 having the thermally protective material 30 adjacent to the e-paper 20 on edges 22 of the e-paper 20 and a backside 23 of the e-paper 20, and injection molding the injection molded body element 40 around the thermally protective material 30. During the injection molding leads extending from the e-paper 20 can protrude from the mold so as to enable later electrical connection of the e-paper 20.

To provide the e-paper 20 having the thermally protective material 30 adjacent thereto, as a first exemplary embodiment, the e-paper 20 can be placed in contact with the thermally protective material 30 in a mold and the material forming the body element 40 injected around the combined structure. Optionally the thermally protective material 30 can first be adhered to the e-paper. For example, the thermally protective material 30 in the form of a sheet or film can be laminated to the e-paper 20.

Figure 6:
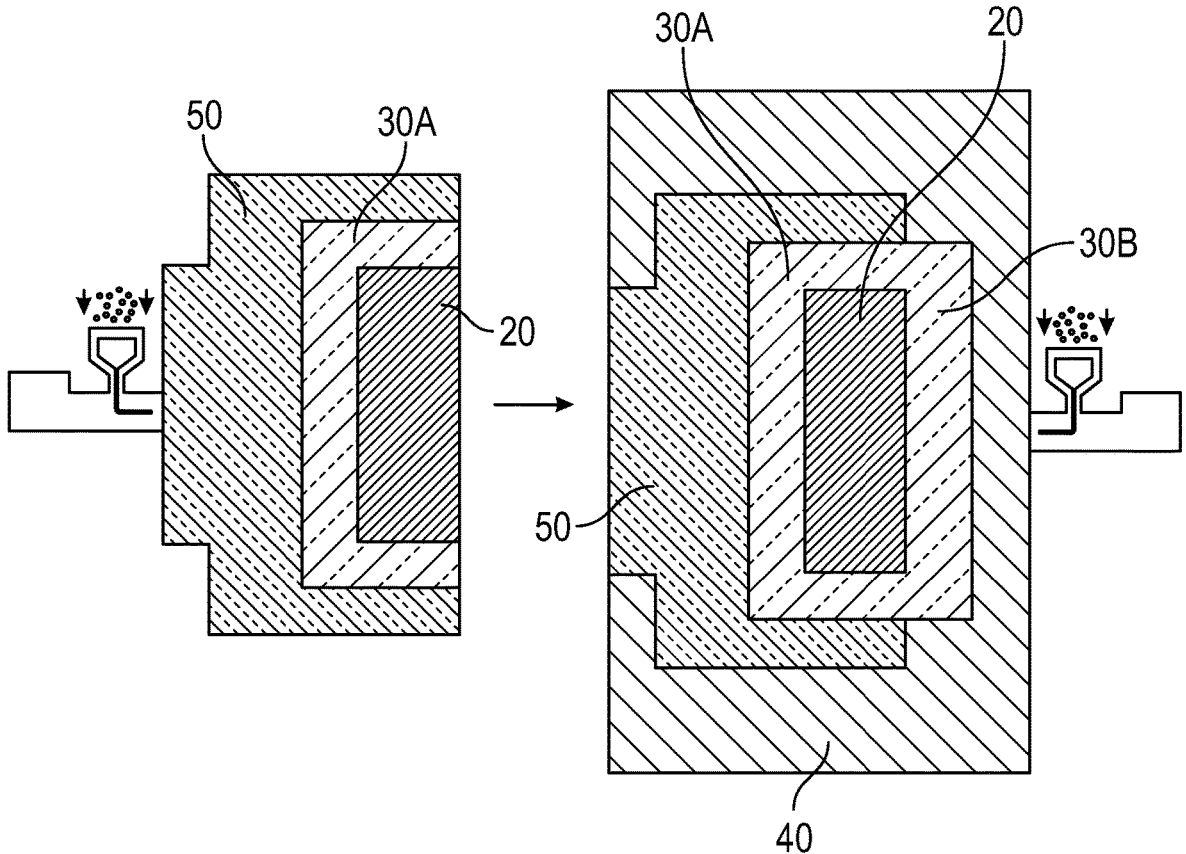
FIG. 6 is a schematic representation of a method of making a body component as in FIG. 2.

As shown in FIG. 6, for example, in a first step a transparent protective material 50 is injection molded around an e-paper 20 that is partially surrounded by thermally protective material 30A. In a second step, an additional thermally protective material 30B is provided adjacent the e-paper 20 and the body element 40 is injection molded around the exposed thermally protective material 30 and a portion of the transparent protective material 50.

In a second exemplary embodiment, the thermally protective material 30 can be thermoformed around the e-paper 20 or a portion of the e-paper 20. Since thermoforming requires softening of the material but not forming a melt, the temperatures required are lower than required for injection molding and can be maintained below about 135, below 130, below 125 or below 120° C. to avoid damage to the e-paper 20. Furthermore, thermoforming can avoid high pressures that may occur during injection molding which could potentially damage the e-paper 20. The thermoforming can be assisted by use of vacuum.

Figure 7:
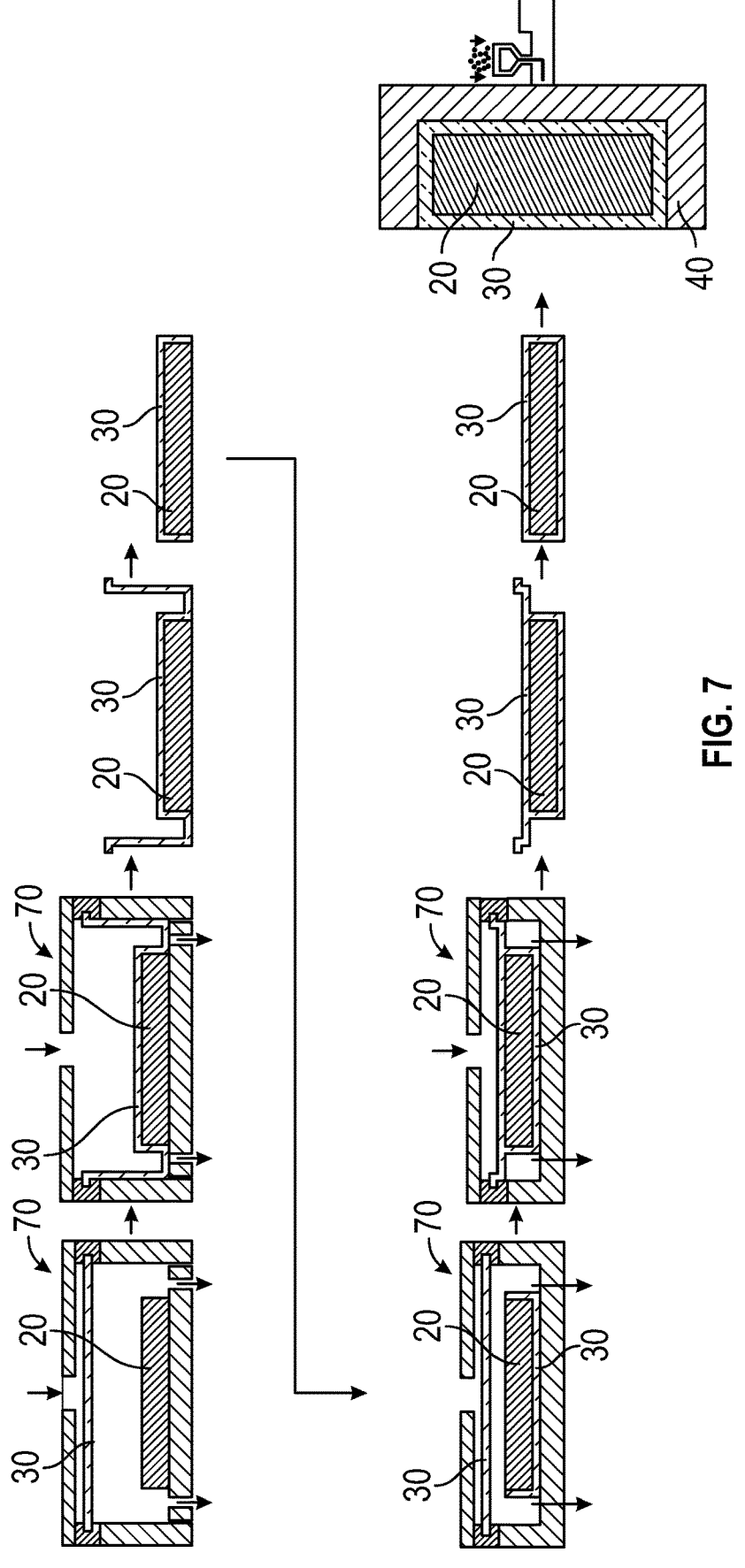
FIG. 7 is a schematic representation of a method of making a body component as in FIG. 3.

For example, as shown in FIG. 7, e-paper 20 may be provided with a thermally protective material 30 in the form of a sheet or film. In a first step, the e-paper 20 and thermally protective material 30 can be placed in a thermoforming device 70. In a second step air pressure, P, is applied and vacuum, V, is drawn, thereby conforming the thermally protective material 30 to the e-paper 20. In third and fourth steps, the e-paper 20 with conformal thermally protective material 30 is removed from the thermoforming device 70 and excess portions of thermally protective material are trimmed off. In a fifth and sixth steps, the e-paper 20 with trimmed conformal thermally protective material 30 can be placed again in a thermoforming device 70 with an additional sheet or film of thermally protective material 30 to protect another side of the e-paper 20. The resulting article of e-paper 20 protected by thermally protective material 30 is removed from the thermoforming device 70 and excess thermally protective material 30 is trimmed. The e-paper 20 is then fully protected by the thermally protective material 30 and the body element 40 is injection molded around three sides of the combination of the thermally protective material 30 and e-paper 20.

The injection molding of the body element 40 can occur for example at melt temperatures of at least 250 or at least 265° C. up to about 350 or 300° C.

The terms "a" and "an" do not denote a limitation of quantity, but rather denote the presence of at least one of the referenced items. The term "or" means "and/or" unless clearly indicated otherwise by context. Reference throughout the specification to "an aspect", means that a particular element (e.g., feature, structure, step, or characteristic) described in connection with the aspect is included in at least one aspect described herein, and may or may not be present in other aspects. In addition, it is to be understood that the described elements may be combined in any suitable manner in the various aspects.

When an element such as a layer, film, region, or substrate is referred to as being "on" another element, it can be directly on the other element or intervening elements may also be present. In contrast, when an element is referred to as being "directly on" another element, there are no intervening elements present.

Unless specified to the contrary herein, all test standards are the most recent standard in effect as of the filing date of this application, or, if priority is claimed, the filing date of the earliest priority application in which the test standard appears.

Unless defined otherwise, technical and scientific terms used herein have the same meaning as is commonly understood by one of skill in the art to which this disclosure belongs.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A body component for a transportation vehicle comprising:
   an e-paper visible from a front side of the body component;
   a thermally protective material at least partially surrounding the e-paper; and
   an injection molded body element located around at least a portion of the thermally protective material,
   wherein the thermally protective material comprises a multi-layer film having a thermally conductive layer and a polymer layer, the polymer layer being located between the thermally conductive layer and the e-paper.

2. The body component of claim 1 wherein the thermally protective material comprises a polymeric material.

3. The body component of claim 2 wherein the polymeric material is selected from polycarbonates, polyacrylates, polymethacrylates, polyesters, polyethylene, polypropylene, polyurethanes, or combinations thereof.

4. The body component of claim 1 wherein the thermally conductive layer comprises boron nitride, graphene or indium tin oxide and has a thickness of 50 to 200 micrometers.

5. The body component of claim 1 wherein the multi-layer film additionally comprises an adhesive layer in contact with the e-paper.

6. The body component of claim 1 further comprising a transparent protective polymer on the front side of the body component through which the e-paper is visible.

7. The body component of claim 1 wherein the thermally protective material is located on a front side of the e-paper, a backside of the e-paper, and side edges of the e-paper.

8. The body component of claim 1 further comprising electrical leads connected to the e-paper and extending through the injection molded body element for connecting to a device to enable formation of an image on the e-paper.

9. A vehicle comprising a body component comprising:
   an e-paper visible from a front side of the body component;
   a thermally protective material at least partially surrounding the e-paper; and
   an injection molded body element located around at least a portion of the thermally protective material, wherein the thermally protective material comprises a multi-layer film having a thermally conductive layer and a polymer layer, the polymer layer being located between the thermally conductive layer and the e-paper.

10. The vehicle of claim 9 wherein the body component is provided as a digital license plate.

11. A method of making a body component comprising:
   providing an e-paper having a thermally protective material adjacent to the e-paper on edges of the e-paper and a backside of the e-paper, and
   injection molding a body element around the thermally protective material,
   wherein the thermally protective material comprises a multi-layer film having a thermally conductive layer and a polymer layer, the polymer layer being located between the thermally conductive layer and the e-paper.

12. The method of claim 11 wherein the injection molding of the body element occurs at a melt temperature of at least 250° C.

13. The method of claim 11 further comprising providing a transparent protective polymer on a front side of the e-paper.

14. The method of claim 13 wherein the thermally protective material is adjacent to the front side of the e-paper and the transparent protective polymer is injection molded over the thermally protective material adjacent to the front side of the e-paper.

15. The method of claim 11 wherein the thermally protective material is provided in the form of a film or a sheet.

16. The method of claim 15 wherein the film or sheet is multi-layer.

17. The method of claim 15 wherein the multi-layer film or sheet comprises a thermally conductive layer and a polymeric layer and the polymeric layer is located between the e-paper and the thermally conductive layer.

18. The method of claim 15 wherein the film or the sheet is thermoformed around the e-paper.

19. The method of claim 15 wherein the film or the sheet is laminated to the e-paper.

* * * * *